United States Patent [19]

Murakami

[11] 4,447,893
[45] May 8, 1984

[54] SEMICONDUCTOR READ ONLY MEMORY DEVICE

[75] Inventor: Jyoji Murakami, Kawasaki, Japan

[73] Assignee: Fujitsu Limited, Kawasaki, Japan

[21] Appl. No.: 287,130

[22] Filed: Jul. 27, 1981

[30] Foreign Application Priority Data

Jul. 31, 1980 [JP] Japan .................................. 55-105882

[51] Int. Cl.³ .............................................. G11C 7/00
[52] U.S. Cl. .................................. 365/203; 365/189
[58] Field of Search ........................ 365/189, 203, 230

[56] References Cited

U.S. PATENT DOCUMENTS 3,942,162 3/1976 Buchanan ........................... 365/203
4,110,840 8/1978 Abe et al. ........................... 365/203

*Primary Examiner*—James W. Moffitt
*Attorney, Agent, or Firm*—Staas & Halsey

[57] ABSTRACT

A semiconductor read only memory device comprises bit lines, word lines, a load transistor, a multiplexer including a plurality of transistors, and a memory cell array in which each memory cell has one transistor having a gate connected to one of the word lines and corresponding to one of the bit lines connected to the transistors of the multiplexer. A gate transistor is inserted between the load transistor and the multiplexer, and a gate voltage control circuit, for selectively providing a higher level signal and a lower level signal, is connected to the gate transistor.

4 Claims, 4 Drawing Figures

SEMICONDUCTOR READ ONLY MEMORY DEVICE

BACKGROUND OF THE INVENTION

This invention relates to a semiconductor memory device, especially to a semiconductor mask read only memory device with a high speed read cycle.

Generally, there are two types of read only memory (ROM) which may be used as the storage device of a digital computer. One is a programmable read only memory (PROM) which can be programmed when it is used, and the other is a mask ROM which is programmed during the manufacturing process.

In recent years, in accordance with the miniaturization and the speed up of the computer, it is required to integrate a mask ROM used for storing a computer program etc. on a larger scale and to speed up its read out time.

In FIG. 1, a prior art semiconductor mask ROM is illustrated. The mask ROM of FIG. 1 comprises a load transistor of a depletion type $Q_L$, a multiplexer MPX consisting of a plurality of transistors $Q_{x0}, Q_{x1} \ldots Q_{xn}$ to the gates of which the address selecting signals $A_0, A_1 \ldots A_n$ are respectively applied, a memory cell array having transistors $Q_{ij}$ ($i=0, 1 \ldots m, j=0, 1 \ldots n$) with gates connected to the word lines $WL_0, WL_1 \ldots WL_m$, and a gate transistor $Q_G$ inserted between the load transistor $Q_L$ and the multiplexer MPX. The ROM of FIG. 1 is used for example in the one chip microprocessor MC6801 manufactured by MOTOROLA Corporation.

As shown in FIG. 1, the gate of the gate transistor $Q_G$ is supplied with the output signal of a voltage control circuit CNT. In the voltage control circuit CNT, a depletion type transistor $Q_{c1}$ and transistors $Q_{c2}$ and $Q_{c3}$ are connected in series between the voltage source $V_{cc}$ and ground. The voltage $V(N_0)$ at the node $N_0$ where the load transistor $Q_L$ and the gate transistor $Q_G$ are connected, is supplied to the data bus line DB through the buffer circuit BUF as shown. In the buffer circuit BUF, there are provided gate circuits $GT_1, GT_2$ and transistors $Q_{B1}, Q_{B2}$ interconnected as shown in FIG. 1.

The transistors $Q_{x0}, Q_{x1} \ldots Q_{xn}$ of the multiplexer MPX, are connected to the bit lines $BL_0, BL_1 \ldots BL_n$ respectively, the transistor $Q_{ij}$ ($i=0, 1 \ldots m, j=0, 1 \ldots n$) of the memory cell array corresponds to the word line $WL_i$ and the bit line $BL_j$. The gate of the transistor $Q_{ij}$ is connected to the word line $WL_i$ and its source is connected to the ground. The drain of the transistor $Q_{ij}$ is connected to the bit line $BL_j$ when the data "0" is stored in the memory cell of the transistor $Q_{ij}$, and the drain of the transistor $Q_{ij}$ is disconnected from the bit line $BL_j$ when the data "1" is stored in this memory cell.

The read operation in the ROM of FIG. 1 is as follows. The ROM of FIG. 1 has two operation modes, one mode is the preparation operation for reading and the other mode is the reading operation. In the preparation operation for reading all selecting signals $A_0, A_1 \ldots A_n$ of the multiplexer MPX and all word lines $WL_0, WL_1 \ldots WL_m$ are set to the "H" level. Therefore, all transistors $Q_{ij}$ of the memory cell array MCA become conductive and consequently the charge accumulated in the stray capacity of each bit line $BL_0, BL_1 \ldots BL_n$ is discharged through the transistors $Q_{ij}$ connected to the bit line $BL_j$ and the potentials at the bit lines $BL_0, BL_1 \ldots BL_n$ decrease to the ground level. According to the decrease of the potentials at the bit lines $BL_0, BL_1 \ldots BL_n$, the charge accumulated in the stray capacity of the node $N_0$ is discharged through the gate transistor $Q_G$ and the transistors $Q_{x0}, Q_{x1} \ldots Q_{xn}$ of the multiplexer MPX. Therefore, the potential at the node $N_0$ goes to the "L" level.

Then, in the reading operation, in order to read the data stored in a certain memory cell, one of the selecting signals $A_0, A_1 \ldots A_n$ and one of the word lines $WL_0, WL_1 \ldots WL_m$ are kept at the "H" level, and the other selecting signals and the other word lines are set to the "L" level. For example, in the case of reading the memory cell of the transistor $Q_{01}$, only the selecting signal $A_1$ and the word line $WL_0$ are kept at the "H" level, and the other selecting signals $A_0, A_2 \ldots A_n$ and the other word lines $WL_1, WL_2 \ldots WL_m$ are set to the "L" level. In this case, only the transistor $Q_{x1}$ is conductive and all the other transistors $Q_{xj}$ of the multiplexer MPX are non-conductive. Among the transistors $Q_{j1}$ of bit line $BL_1$, only the transistor $Q_{01}$ is conductive and the other transistors $Q_{j1}$ are non-conductive. As the transistor $Q_{01}$ is connected to the bit line $BL_1$, the current supplied from the voltage source $V_{cc}$ flows through transistors $Q_L, Q_G, Q_{x1}$ and $Q_{01}$ to ground, and therefore the charge is not accumulated in the stray capacity of the node $N_0$ and the potential at the node $N_0$ is held at the "L" level. Accordingly, the data of "L" level (that is "0") is transmitted to the data bus line DB through the buffer circuit BUF.

Then, in the case of reading the memory cell of the transistor $Q_{11}$, only the selecting signal $A_1$ and the word line $WL_1$ are held to the "H" level. Accordingly, among the transistors of the multiplexer MPX only $Q_{x1}$ is conductive and among the transistors of the bit line $BL_1$ only $Q_{11}$ is conductive. In this case, the transistor $Q_{11}$ is disconnected from the bit line $BL_1$ so that the bit line $BL_1$ is disconnected from ground. Therefore, the current supplied from the voltage source $V_{cc}$ flows into the stray capacity of the bit line $BL_1$ through transistors $Q_L, Q_G$ and $Q_{x1}$, and the capacity is charged by this current. Thus, the potentials at the bit line $BL_1$ and the node $N_0$ rises up and reach the "H" level. This "H" level signal of the node $N_0$ is transmitted to the data bus DB through the buffer circuit BUF.

However, in the ROM of FIG. 1, together with the increase in the memory capacity and the integration scale of a memory device, the size of the transistor $Q_{ij}$ of the memory cell becomes smaller, so that the resistance of the main current path of the transistor $Q_{ij}$ becomes greater. Since the output signal level of the node $N_0$ in the case of reading "L" level data, is mainly determined by the ratio between the resistors of the memory cell transistor $Q_{ij}$ and the load transistor $Q_L$, in order to obtain an appropriate output signal level, it is necessary to make the resistance of the load transistor $Q_L$ proportionally greater. However, since in accordance with the increase in the resistance of the main current path of the load transistor $Q_L$, the drive capacity of the load transistor $Q_L$ decreases, it takes a relatively longer time to charge the bit lines having an equivalently large capacity, and to raise the potential to the "H" level.

In order to prevent an increase in the access time of the memory device due to the above-mentioned decrease in the drive capacity of the load transistor $Q_L$, in accordance with the ROM of FIG. 1 the gate transistor $Q_G$ is provided. The function of the gate transistor $Q_G$ in the above-mentioned reading operation of the memory cell transistor $Q_{11}$ will now be described. As described above, in the reading operation of the transistor $Q_{11}$, the charge accumulated in the stray capacity of the bit line $BL_1$ is supplied from the voltage source $V_{cc}$ through the load transistor $Q_L$, the gate transistor $Q_G$ and the transistor $Q_{x1}$ of the multiplexer MPX. The output signal $V_{INT}$ of the gate voltage control circuit CNT is applied to the gate of the gate transistor $Q_G$, and if the potential at the node $N_1$ connected to the source of the gate transistor $Q_G$ is lower than the level of the signal $V_{INT}$, the resistance of the main current path of the gate transistor $Q_G$ is relatively small, and therefore the potential at the bit line $BL_1$ rises gradually according to the drive capacity of the load transistor $Q_L$. In accordance with this, the potentials at the nodes $N_0$ and $N_1$ also rise, and when the difference, between the potentials at the gate of the gate transistor $Q_G$ and at the node $N_1$, is below the threshold voltage $V_{TH}$ of the gate transistor $Q_G$, the gate transistor $Q_G$ is turned into the cut-off state, so that the bit line $BL_1$ and the node $N_1$ are separated from the node $N_0$. Therefore, the potential at the node $N_0$ which has been rising gradually in accordance with the potential at the bit line $BL_1$, then rises rapidly and goes to the "H" level.

As described above, in accordance with the ROM of FIG. 1, since the stray capacity of the bit line $BL_j$ is separated from the node $N_0$ by means of the gate transistor $Q_G$, in spite of the small drive capacity of the load transistor $Q_L$, an increase in the access time of the memory cell can be prevented. However, since the gate voltage of the gate transistor $Q_G$ is between the voltage source $V_{cc}$ and ground level, the resistance value of the gate transistor $Q_G$ as a resistance element is relatively great. Therefore, in the ROM of FIG. 1, although the reading operation time becomes shorter, there is a problem in that it takes a rather long time to decrease the potential at the node $N_0$ to the "L" level in the preparation operation for reading.

SUMMARY OF THE INVENTION

The main object of the present invention is to solve the above-mentioned problem of the semiconductor read only memory device and to speed up the read cycle time in the memory device with a larger memory capacity and with integration on a larger scale.

In accordance with the present invention, there is provided a semiconductor read only memory device comprising a plurality of bit lines, a plurality of word lines, a load transistor electrically connected to a voltage source, a multiplexer including a plurality of transistors each of which is electrically connected to one of the plurality of bit lines, a memory cell array in which each memory cell has one transistor having a gate electrically connected to one of the word lines and a source or a drain region electrically connected to one of the bit lines, a gate transistor, and a gate voltage control circuit for selectively providing, to the gate of the gate transistor, a higher level signal during a preparation period of the memory device and lower level signal during a reading period of the memory device.

DESCRIPTION OF THE PREFERRED EMBODIMENTS

Figure 2:
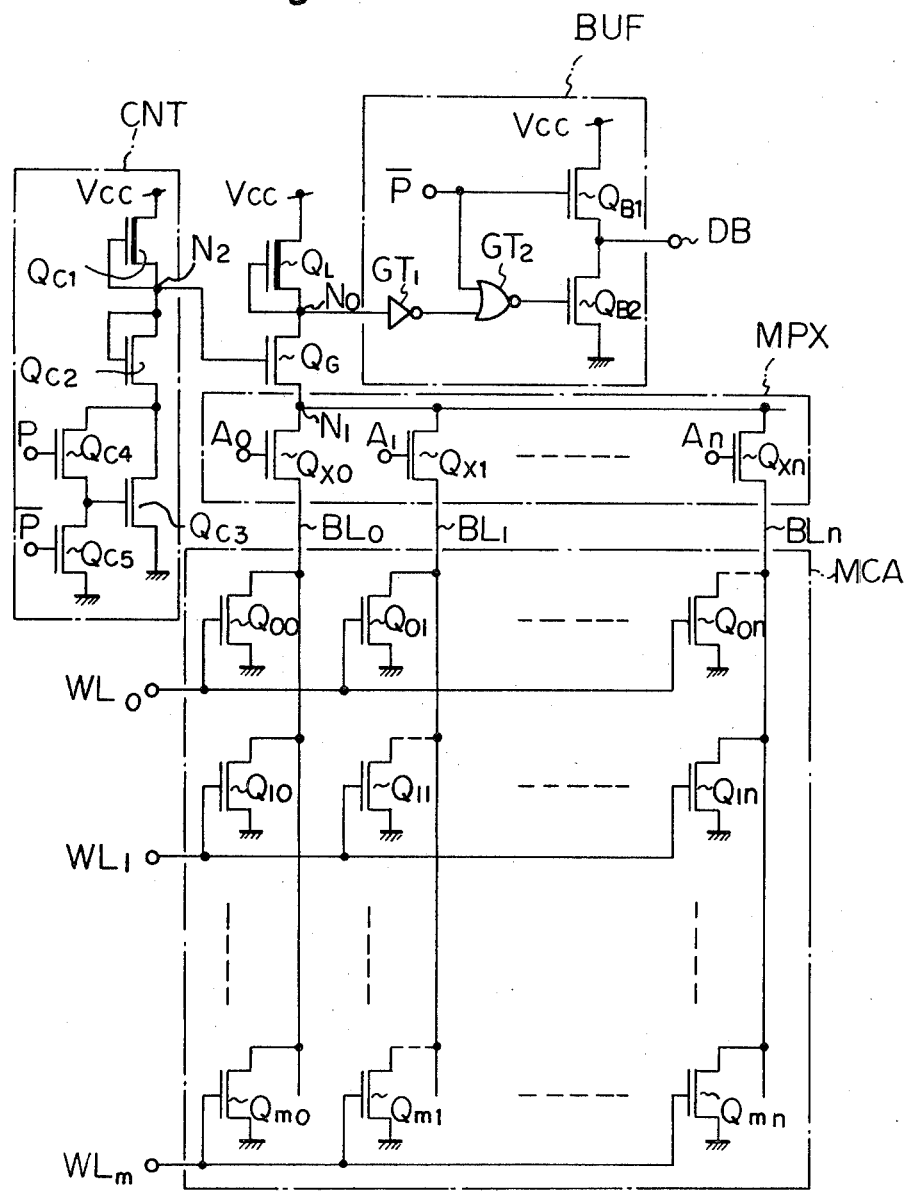
FIG. 2 is a circuit diagram of an embodiment of a semiconductor read only memory device in accordance with the present invention.

A semiconductor read only memory device in accordance with the present invention is illustrated in FIG. 2. In the read only memory of FIG. 2, there are provided a load transistor $Q_L$, a multiplexer MPX including a plurality of transistors $Q_{x0}, Q_{x1} \ldots Q_{xn}$, a memory cell array MCA comprising transistors $Q_{ij}$ (i=0, 1 ... m, j=0, 1 ... n), a gate transistor $Q_G$ inserted between the load transistor $Q_L$ and the multiplexer MPX, a gate voltage control circuit CNT controlling the gate voltage of the gate transistor $Q_G$, and, a buffer circuit BUF transmitting the voltage level at the node $N_0$ between the load transistor $Q_L$ and the gate transistor $Q_G$ to the data bus line DB.

Figure 1:
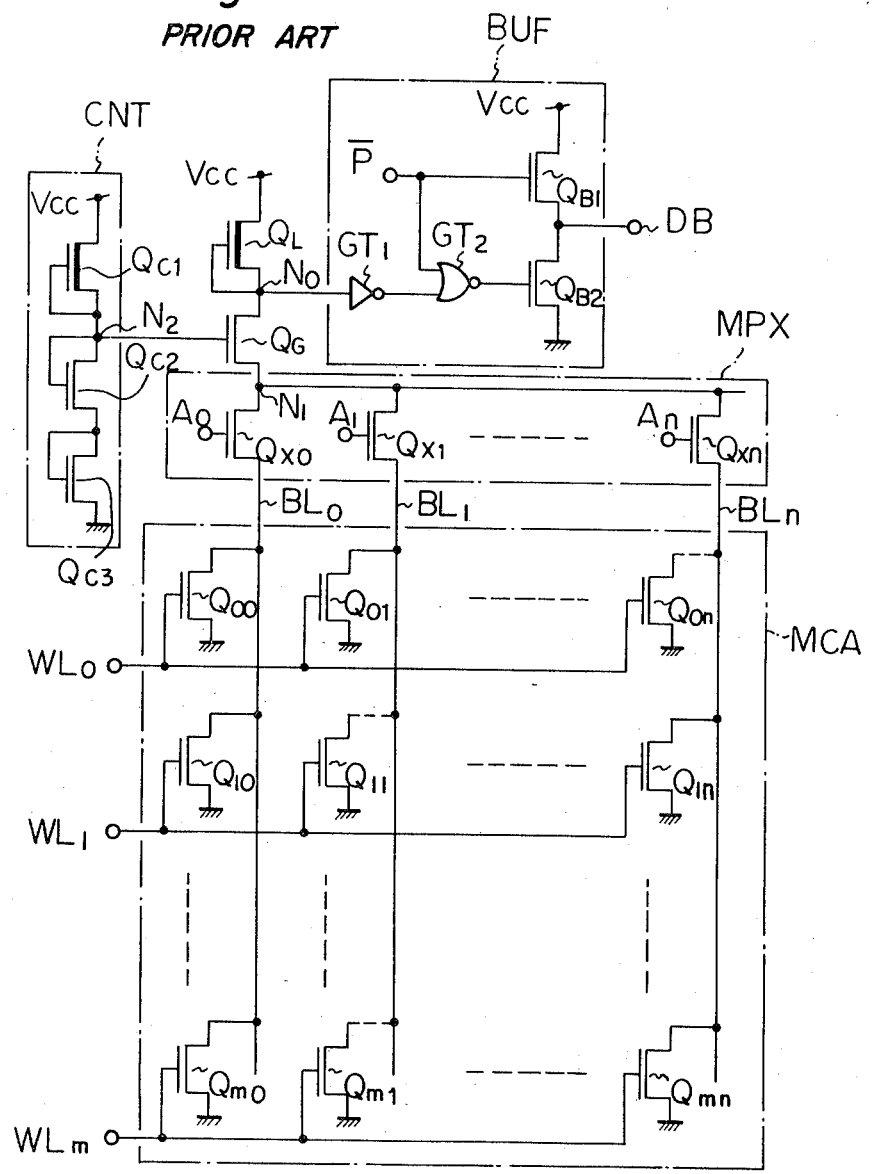
FIG. 1 is a circuit diagram of a prior art semiconductor read only memory device.

The device shown in FIG. 2 has the same construction as that of the device of FIG. 1 except for the gate voltage control circuit CNT. The gate voltage control circuit CNT has a depletion type transistor $Q_{c1}$ and transistors $Q_{c2}$, $Q_{c3}$, $Q_{c4}$ and $Q_{c5}$.

Figure 3:
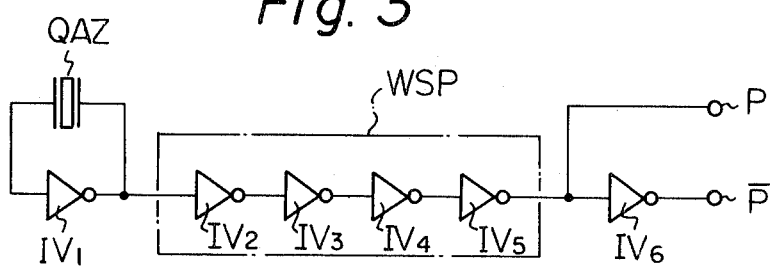
FIG. 3 is a circuit diagram of a clock pulse generator for supplying the ROM of FIG. 2 with a system clock pulse.

The ROM of FIG. 2 may be supplied with a clock pulse signal P and its inverted signal $\overline{P}$ from a clock pulse generating circuit such as is shown in FIG. 3. In the clock pulse generating circuit of FIG. 3, a waveform generated by a quartz oscillator QAZ and an inverting amplifier $IV_1$ is shaped by a wave-shaping circuit WSP and the shaped waveform is outputted as a system clock pulse P and its inverted waveform is outputted as $\overline{P}$. In the wave-shaping circuit, several inverters $IV_2$, $IV_3 \ldots IV_5$ are connected in series.

Figure 4:
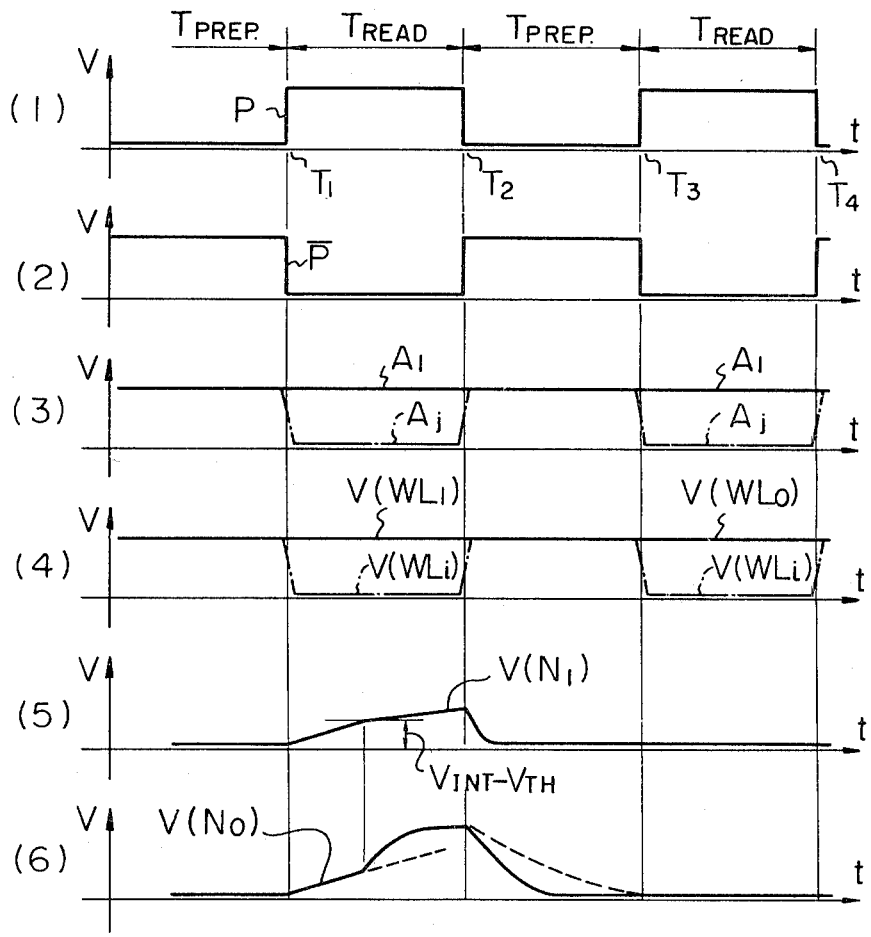
FIGS. 4 (1) through (6) are graphs illustrating various waveforms for explaining the read operation of the ROM of FIG. 2.

In FIGS. 4 (1) through (6), there are illustrated various waveforms to explain the access operation of the ROM of FIG. 2. In FIGS. 4 (1) and (2), the system clock pulse P and its inverted pulse $\overline{P}$ are illustrated respectively. In the waveform P illustrated in FIG. 4 (1), the period when the level of the waveform is "L" is the preparation period $T_{PREP}$ of the memory device, and the period when the level of the waveform is "H" is the reading period $T_{READ}$ of the memory device. Accordingly, in the ROM of FIG. 2, the read operation is effected in phase with the system clock P.

In the control circuit CNT of FIG. 2, the system clock signal P is applied to the gate of the transistor $Q_{c4}$, and the inverted signal $\overline{P}$ of the system clock is applied to the gate of the transistor $Q_{c5}$. Therefore, in the preparation period $T_{PREP}$, the transistor $Q_{c4}$ is OFF and the transistor $Q_{c5}$ is ON and consequently the gate voltage of the transistor $Q_{c3}$ is the "L" level and the transistor $Q_{c3}$ is OFF. Accordingly, the voltage at the node $N_2$ connected to the gate of the gate transistor $Q_G$ becomes almost equal to the voltage source $V_{cc}$, because the node $N_2$ is connected to $V_{cc}$ through the depletion type transistor $Q_{c1}$ and cut-off from the ground. On the other hand, in the reading period $T_{READ}$, since the transistor $Q_{c4}$ is ON and the transistor $Q_{c5}$ is OFF, and then the transistor $Q_{c3}$ is ON. Accordingly, the current path between the voltage source $V_{cc}$ and and the ground is formed through the transistors $Q_{c1}$, $Q_{c2}$ and $Q_{c3}$, and the voltage at the node $N_2$ applied to the gate of the gate transistor $Q_G$ is dropped to the intermediate level $V_{INT}$ which is divided by the depletion type transistor $Q_{c1}$ and other transistors $Q_{c2}$, $Q_{c3}$.

In FIGS. 4 (3) through (6), there are illustrated voltage waveforms at various points of the ROM of FIG. 2 in the case where the memory cell transistor $Q_{11}$ is read-out in the first reading period $T_{READ}$ (between $T_1$ and $T_2$) in FIG. 4 (1), and the memory cell transistor $Q_{01}$ is read-out in the second reading period $T_{READ}$ (between $T_3$ and $T_4$).

As shown in FIGS. 4 (3) and (4), in the preparation period $T_{PREP}$, all the selecting signals $A_0, A_1 \ldots A_n$ for the transistors $Q_{x0}, Q_{x1} \ldots Q_{xn}$ are "H" level and all the word lines $WL_0, WL_1 \ldots WL_m$ are also "H" level. Therefore, the potential $V(N_1)$ at the node $N_1$ and the potential $V(N_0)$ at the node $N_0$ are "L" level. At the instant $T_1$, the system clock signal P rises up to "H" level and then all the selecting signals $A_0, A_2 \ldots A_n$ except $A_1$ turn to the "L" level, and also all the word lines $WL_0, WL_2 \ldots WL_m$ except $WL_1$ turn to the "L" level.

Therefore, all the transistors $Q_{x0}, Q_{x2} \ldots Q_{xn}$ of the multiplexer MPX except $Q_{x1}$ are turned OFF and only the bit line $BL_1$ is connected to the node $N_1$ through the transistor $Q_{x1}$. In addition, all the memory cell transistors $Q_{ij}$, except those connected to the word line $WL_1$ (that is, except $Q_{10}, Q_{11} \ldots Q_{1n}$), are turned OFF. Since the memory cell transistor $Q_{11}$ which corresponds to the bit line $BL_1$ and the word line $WL_1$, is not connected to the bit line $BL_1$, the bit line $BL_1$ is separated from ground and consequently the potentials at the bit line $BL_1$ and the node $N_1$ begin to rise because of the current supplied through the load transistor $Q_L$ and the gate transistor $Q_G$.

In FIGS. 4 (5) and (6), the potentials $V(N_1)$ and $V(N_0)$ at the nodes $N_1$ and $N_2$ are illustrated respectively. As described above, the intermediate level signal $V_{INT}$ is applied to the gate of the gate transistor $Q_G$ in the reading period $T_{READ}$, and the potential $V(N_1)$ is almost at ground level at first, so that the potential $V(N_1)$ at the node $N_1$ rises gradually by means of the relatively great resistance of the load transistor $Q_L$. When the potential $V(N_1)$ attains a level lower than the gate voltage $V_{INT}$ by an amount equal to the threshold voltage $V_{TH}$ of the gate transistor $Q_G$, the gate transistor $Q_G$ turns OFF, and after that time the potential $V(N_1)$ does not rise any more. On the other hand, the potential $V(N_0)$ at the node $N_0$ begins to rise up rapidly because the node $N_0$ is separated from the node $N_1$ and the bit line $BL_1$, and the potential $V(N_0)$ attains the "H" level immediately. Thus, the read operation of the "H" level data is made shorter than in the case where the gate transistor $Q_G$ does not turn off, as shown in the broken line of FIG. 4 (6).

At the instant $T_2$, the system clock signal P changes to the "L" level, and then all the selecting signals $A_0, A_1 \ldots A_n$ and all the word lines $WL_0, WL_1 \ldots WL_m$ turn to the "H" level. Consequently, all the transistors $Q_{x0}, Q_{x1} \ldots Q_{xn}$ of the multiplexer MPX turn ON and all the memory cell transistors $Q_{ij}$ also turn ON. Then, the potentials at the bit line $BL_1$ and the node $N_1$ decrease rapidly to the ground potential. On the other hand, the charge accumulated in the stray capacity of the node $N_0$ is drawn to the node $N_1$ through the gate transistor $Q_G$. As described above, the $V_{cc}$ level signal is applied to the gate of the gate transistor $Q_G$ in the preparation time $T_{PREP}$ so that the gate transistor $Q_G$ is sufficiently conductive and its resistance is substantially small. Therefore, the potential $V(N_0)$ at the node $N_0$ drops to the "L" level in a short time.

Then, at the instant $T_3$, the system clock signal P turns to the "H" level, and all the selecting signals $A_0, A_2 \ldots A_n$ except $A_1$ and all the word lines $WL_1, WL_2$ $\ldots WL_m$ except $WL_0$ turn to the "L" level. Accordingly, only the transistor $Q_{x1}$ of the multiplexer MPX is kept ON and other transistors $Q_{x0}, Q_{x2} \ldots Q_{xn}$ turn OFF. Therefore, only the bit line $BL_1$ is connected to the node $N_1$. Since the memory cell transistor $Q_{01}$ is turned ON by the word line $WL_1$ and the transistor $Q_{01}$ is connected to the bit line $BL_1$, the potential at the bit line $BL_1$ is kept at the "L" level, and the potentials at the nodes $N_1$ and $N_0$ are also kept at the "L" level. Thus, the reading operation of the "L" level data is effected almost instantly.

As described above, in accordance with the ROM of FIG. 2, by changing the gate voltage of the gate transistor between the preparation period and the reading period of the memory device, the read operation time can be made shorter.

What is claimed is:

1. A semiconductor read only memory device operatively connectable to receive a clock signal, connected to a voltage source and having a preparation period and a reading period, comprising:
   a plurality of bit lines;
   a plurality of word lines;
   a load transistor electrically connected to the voltage source;
   a multiplexer including a plurality of transistors each of which is elelctrically connected to one of said plurality of bit lines;
   a memory cell array in which each memory cell has one transistor having a gate electrically connected to one of said plurality of word lines and a source or a drain electrically connected to one of said plurality of bit lines;
   a gate transistor connected between said load transistor and said multiplexer; and
   gate voltage control means, connected to said gate transistor and operatively connectable to receive the clock signal which indicates whether the memory device is in the preparation period or the reading period, for selectively providing, to the gate of said gate transistor, a first level signal during the preparation period and a second level signal during the reading period.

2. A semiconductor read only memory device operatively connectable to receive a clock signal and an inverted clock signal, connected to a voltage source, and having a reading preparation mode and a reading mode, comprising:
   a memory cell array;
   a multiplexer operatively connected to said memory cell array;
   a load transistor operatively connected to the voltage source;
   a gate transistor operatively connected to said load transistor and said multiplexer; and
   a gate voltage control circuit, operatively connectable to receive the clock signal and the inverted clock signal and operatively connected to said gate transistor, for providing a first level signal to said gate transistor during the reading preparation mode of said semiconductor read only memory device and for providing a second level signal to said gate transistor during the reading mode of said semiconductor read only memory device, said gate voltage control circuit comprising:
   a first transistor operatively connected to the voltage source and operatively connected to said gate transistor at a first node;

a second transistor operatively connected at said first node;

a third transistor operatively connectable to receive the clock signal and operatively connected to said second transistor;

a fourth transistor operatively connectable to receive the inverted clock signal, operatively connected to said third transistor at a second node and operatively connected to a reference potential; and a fifth transistor operatively connected to said second and third transistors, operatively connected at said second node and operatively connected to the reference potential.

3. A semiconductor read only memory device as set forth in claim 2, wherein said gate transistor is a field effect transistor having a gate connected at said first node.

4. A semiconductor read only memory device as set forth in claim 3, wherein said first, second, third, fourth and fifth transistors are field effect transistors.

* * * * *